(12) United States Patent
Li et al.

(10) Patent No.: US 10,043,941 B1
(45) Date of Patent: Aug. 7, 2018

(54) LIGHT EMITTING DIODE HAVING IMPROVED QUANTUM EFFICIENCY AT LOW INJECTION CURRENT

(71) Applicant: International Business Machines Corporation, Armonk, NY (US)

(72) Inventors: Ning Li, White Plains, NY (US); Qinglong Li, Bristow, VA (US); Kunal Mukherjee, Goleta, CA (US); Devendra K. Sadana, Pleasantville, NY (US); Ghavam G. Shahidi, Pound Ridge, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/420,403

(22) Filed: Jan. 31, 2017

(51) Int. Cl.
  *H01L 33/00* (2010.01)
  *H01L 33/06* (2010.01)
  *H01L 33/12* (2010.01)
  *H01L 29/12* (2006.01)

(52) U.S. Cl.
  CPC ...... *H01L 33/0062* (2013.01); *H01L 33/0025* (2013.01); *H01L 33/06* (2013.01); *H01L 33/12* (2013.01); *H01L 29/122* (2013.01); *H01L 29/127* (2013.01)

(58) Field of Classification Search
  CPC . H01L 33/0062; H01L 33/0025; H01L 33/06; H01L 33/12; H01L 29/122–29/127
  See application file for complete search history.

(56) References Cited

U.S. PATENT DOCUMENTS

| 4,342,944 | A | | 8/1982 | Springthorpe | |
|---|---|---|---|---|---|
| 5,539,763 | A | * | 7/1996 | Takemi | G02B 6/124 257/E27.12 |
| 5,583,878 | A | * | 12/1996 | Shimizu | B82Y 20/00 372/45.01 |
| 5,657,189 | A | * | 8/1997 | Sandhu | G01R 33/06 257/421 |
| 5,696,389 | A | | 12/1997 | Ishikawa et al. | |

(Continued)

OTHER PUBLICATIONS

H. Zhao et al., "Analysis of internal quantum efficiency and current injection efficiency in III-nitride light-emitting diodes," Journal of Display Technology, vol. 9, No. 4, 2013, pp. 212-225.

(Continued)

*Primary Examiner* — Ida M Soward
(74) *Attorney, Agent, or Firm* — Cantor Colburn LLP; David Quinn

(57) ABSTRACT

Provided is a light emitting semiconductor structure that operates as a light emitting diode (LED). In embodiments of the invention, the light emitting semiconductor structure includes a first barrier region, a second barrier region, and a single quantum well having a preselected thickness between the first barrier region and the second barrier region. The preselected thickness according to embodiments is selected to achieve a predetermined charge density in the quantum well. The predetermined charge density according to embodiments results from a predetermined bias current applied to the semiconductor structure. The predetermined bias current according to embodiments comprises less than about 1 mA.

7 Claims, 3 Drawing Sheets

(56) References Cited

U.S. PATENT DOCUMENTS

| | | | | |
|---|---|---|---|---|
| 5,719,893 | A * | 2/1998 | Jiang | B82Y 20/00 372/45.01 |
| 5,751,028 | A * | 5/1998 | Kikkawa | H01L 29/0657 257/192 |
| 5,923,696 | A * | 7/1999 | Ramdani | B82Y 20/00 372/50.11 |
| 6,127,691 | A * | 10/2000 | Fukunaga | B82Y 20/00 257/17 |
| 6,563,851 | B1 * | 5/2003 | Jikutani | B82Y 20/00 372/45.01 |
| 6,984,538 | B2 * | 1/2006 | Ooi | B82Y 20/00 257/E21.086 |
| 7,042,921 | B2 * | 5/2006 | Witzigmann | B82Y 20/00 372/50.11 |
| 7,684,458 | B2 | 3/2010 | Sato et al. | |
| 8,252,567 | B2 | 8/2012 | Verser | |
| 8,421,075 | B2 | 4/2013 | Moon et al. | |
| 8,618,560 | B2 * | 12/2013 | D'Evelyn | H01L 33/44 257/79 |
| 8,772,791 | B2 * | 7/2014 | Hsieh | H01L 33/06 257/79 |
| 8,837,547 | B2 | 9/2014 | Johnson et al. | |
| 9,425,351 | B2 | 8/2016 | Ma et al. | |
| 9,741,903 | B2 * | 8/2017 | Jeong | H01L 33/46 |
| 9,768,346 | B2 * | 9/2017 | Han | H01L 33/06 |
| 2003/0001168 | A1 * | 1/2003 | Tsuda | H01L 33/06 257/103 |
| 2004/0129931 | A1 * | 7/2004 | Asryan | B82Y 20/00 257/14 |
| 2004/0147052 | A1 * | 7/2004 | Takeuchi | H01L 33/007 438/29 |
| 2004/0161006 | A1 * | 8/2004 | Chang | B82Y 20/00 372/45.011 |
| 2004/0233953 | A1 * | 11/2004 | Sato | B82Y 20/00 372/44.01 |
| 2005/0180485 | A1 * | 8/2005 | Shimizu | B82Y 20/00 372/75 |
| 2005/0218419 | A1 * | 10/2005 | Okazaki | H01L 33/40 257/98 |
| 2007/0009001 | A1 * | 1/2007 | Shigihara | B82Y 20/00 372/45.012 |
| 2007/0051939 | A1 * | 3/2007 | Nakahara | B82Y 20/00 257/14 |
| 2011/0186812 | A1 * | 8/2011 | Kim | H01L 33/06 257/13 |
| 2012/0298953 | A1 * | 11/2012 | Sim | H01L 33/025 257/13 |
| 2015/0153628 | A1 * | 6/2015 | Cho | B82Y 20/00 356/601 |
| 2016/0225816 | A1 * | 8/2016 | Choi | H01L 27/15 |
| 2016/0380409 | A1 * | 12/2016 | Ooi | H01S 5/343 438/47 |
| 2017/0012116 | A1 * | 1/2017 | Pillarisetty | H01L 29/165 |
| 2017/0104069 | A1 * | 4/2017 | Pillarisetty | H01L 29/155 |
| 2017/0358705 | A1 * | 12/2017 | Kim | H01L 33/06 |

OTHER PUBLICATIONS

P. Lavenus et al., "Experimental and theoretical analysis of transport properties of core-shell wire light emitting diodes probed by electron beam induced current microscopy," Nanotechnology, vol. 25, No. 25, 2014, 255201, 21 pages.

Th. Gessmann et al., "High-efficiency AlGaInP light-emitting diodes for solid-state lighting applications," Journal of Applied Physics, vol. 95, No. 5, 2004, pp. 2203-2216.

\* cited by examiner

LIGHT EMITTING DIODE HAVING IMPROVED QUANTUM EFFICIENCY AT LOW INJECTION CURRENT

BACKGROUND

The present invention relates to light emitting diodes (LEDs). More specifically, the present invention relates to LEDs with improved efficiency at low injection current.

An LED is a semiconductor device capable emitting light. LEDs function by applying an injection current that injects holes and electrons into an active region at a junction of the LED. Light emission is caused by the spontaneous recombination of electrons and holes.

SUMMARY

One or more embodiments of the invention provide a method for forming a semiconductor structure. The method includes forming a first barrier region, forming a second barrier region, and forming a single quantum well at a preselected thickness between the first barrier region and the second barrier region. The preselected thickness can be selected to achieve a predetermined charge density in the quantum well. The predetermined charge density can result from a predetermined bias current applied to the semiconductor structure. The predetermined bias current can comprise less than about 1 milli-ampere (mA).

One or more embodiments of the invention provide a semiconductor structure. The semiconductor structure includes a first barrier region, a second barrier region, and a single quantum well having a preselected thickness between the first barrier region and the second barrier region. The preselected thickness can be selected to achieve a predetermined charge density in the quantum well. The predetermined charge density can result from a predetermined bias current applied to the semiconductor structure. The predetermined bias current can comprise less than about 1 mA.

One or more embodiments of the invention provide a semiconductor structure. The semiconductor structure includes a first barrier region, a second barrier region, and a single quantum well between the first barrier region and the second barrier region. The single quantum well can have a thickness of about 2 nm to about 10 nm. The first barrier region may or may not include aluminum, and the second barrier region may or may not include aluminum.

BRIEF DESCRIPTION OF THE DRAWINGS

The subject matter of embodiments is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
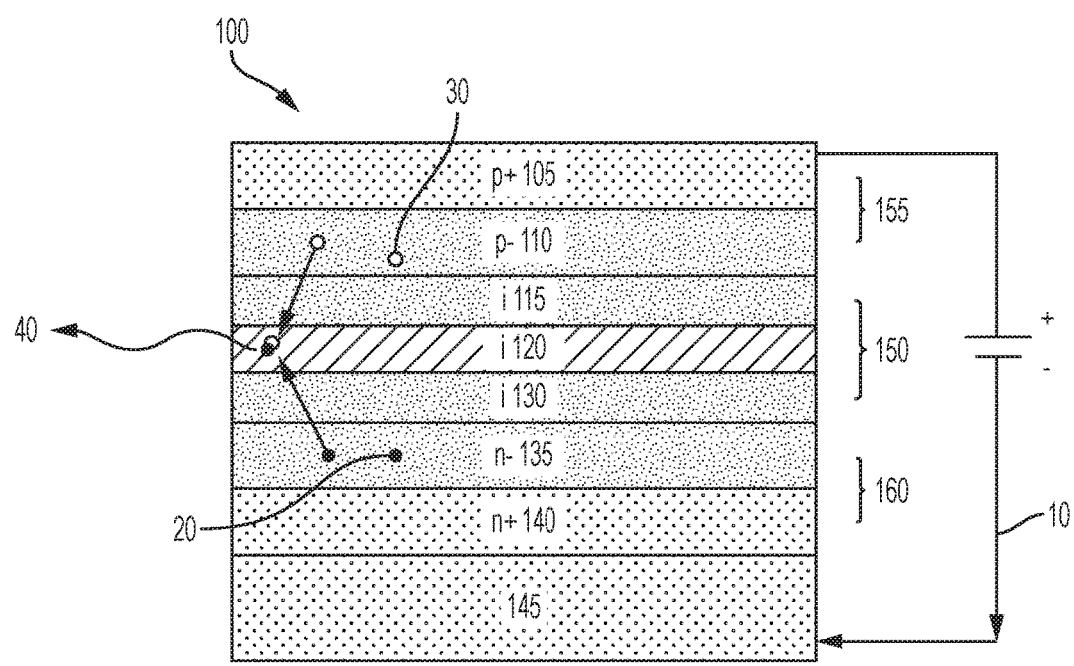
FIG. 1 depicts a semiconductor structure according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

Various processes used can include, for example, film deposition, and semiconductor doping. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Turning now to a more detailed description of technologies that are more specifically relevant to aspects of the present invention, as noted above, LEDs function by forward biasing a junction of the LED with injection current. The flow of injection current through the junction injects holes and electrons into an active region at the junction of the LED. Light emission from the LED is caused by the spontaneous recombination of electrons and holes. The light generation process is called radiative recombination. The percentage of injected carriers (electrons or holes) that generate photons of light is known as quantum efficiency. As used herein, quantum efficiency refers to external quantum efficiency, which is a measure of the ratio of photons emitted from an LED to carriers injected into the LED.

To enhance the level of recombination, the active region can be provided with a relatively thick quantum well, which is a semiconductor layer between other semiconductor layers, and which can confine a high concentration or density of electrons or holes. An example thickness for such quantum wells is about 220 nanometers (nm). The high concentration of electrons and holes in quantum wells is favorable for recombination and light emission. To further enhance the level of recombination in the active region, multiple quantum wells can be implemented by providing alternating layers of different semiconductor material. The alternating layers of different semiconductor material include more than one quantum well active region separated by semiconductor barrier layers.

Even with the use of multiple and relatively thick quantum wells, reaching the necessary quantum efficiency in known LED configurations requires that sufficient charge density is achieved and maintained in the active region because quantum efficiency is proportional to charge density. Quantum efficiency is related to charge density through the concepts of radiative recombination and non-radiative recombination. Radiative recombination is the reverse process of photon absorption. In radiative recombination, an electron drops back down to its equilibrium energy band and radiates a photon. The photon emitted can have the energy of the band gap difference or less, depending on how much energy is lost in the mechanism. Non-radiative recombination is a process in phosphors and semiconductors by which charge carriers recombine without releasing photons. A phonon is released instead. Non-radiative recombination in optoelectronics and phosphors is an unwanted process, lowering the light generation efficiency and increasing heat losses. In semiconductor LED applications, the rate of radiative recombination is proportional to the square of charge density, and the rate of non-radiative recombination is proportional to the charge density itself. Additionally, the ratio of radiative recombination to non-radiative recombination changes with charge density. For some LED configurations the presence of aluminum can induce an increased fraction of non-radiative recombination. Accordingly, in order to maintain quantum efficiency at an acceptable level in known LED configurations, the charge density in the active region must also be maintained at an acceptable level.

Charge density is increased in known LED configurations by increasing injection current. As a result, known LED configurations used for illumination and computer display applications can only reach their peak, or maximum, quantum efficiency at a relatively high injection current of about 1 mA or higher. At a high injection current, charge density is high, and efficiency is high. The rate of radiative recombination is considerably greater than the rate of non-radiative recombination, and the effect of non-radiative recombination on the quantum efficiency is reduced or minimized.

A shortcoming of known LED configurations is that they cannot provide sufficient quantum efficiency in low power applications where the injection currents must be less than about 1 mA.

Decreasing the injection current decreases charge density. At a low injection current (e.g., below about 1 mA), charge density is low, the rate of radiative recombination is not considerably greater than the rate of non-radiative recombination, and non-radiative recombination caused by aluminum negatively impacts the quantum efficiency.

LEDs that reach their peak quantum efficiency at a relatively low injection current of about 1 micro-ampere (μA) to about 1 mA are now needed for internet of things (IoT) applications that require the transmission of data at a low power (i.e., low injection current). Increased LED quantum efficiency at a low injection current is desirable.

Turning now to an overview of aspects of the present invention, one or more embodiments of the invention provide LEDs configured to improve quantum efficiency at relatively low injection currents that are within the range from about 1 μA to about 1 mA. In one or more embodiments of the invention, the LED includes a single quantum well having barrier regions that may or may not include aluminum. The single quantum well includes a relatively thin (e.g., about 2 nm to about 10 nm) light emitting active region. Because the active region (i.e., the quantum well) is relatively thin, sufficient charge density can be achieved at relatively low injection current (e.g., about 1 μA to about 1 mA) in comparison to known LED configurations that use thicker (e.g., about 220 nm) quantum wells and/or multiple quantum wells. More specifically, because the rate of radiative recombination is proportional to the square of charge density, and because the rate of non-radiative recombination is proportional to the charge density itself, the single and relatively thin quantum well utilized in embodiments of the invention increases charge density and results in a rate of radiative recombination that dominates or is significantly greater than the rate of non-radiative recombination, thereby improving quantum efficiency. Optionally, quantum efficiency can further be increased in embodiments of the present invention by omitting aluminum, which even further reduces the rate of non-radiative recombination.

Fabrication methods and resulting structures for semiconductor structures in accordance with embodiments of the invention are described in detail below by referring to the accompanying drawings in FIGS. 1-3.

FIG. 1 depicts a semiconductor structure 100 that forms the functional elements of an LED according to one or more embodiments of the invention. As depicted in FIG. 1, the semiconductor structure 100 includes a substrate 145, an n-type contact region 140, a first barrier region 135, a second barrier region 130, an active region 120, a third barrier region 115, a fourth barrier region 110, and a p-type contact region 105, configured and arranged as shown. In some embodiments of the present invention, the regions of the semiconductor structure 100 are formed by epitaxially growing regions 140, 135, 130, 120, 115, 110, 105 on substrate 145. Semiconductor materials can be epitaxially grown from gaseous or liquid precursors. Epitaxially grown materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of device being formed.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on a semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Semiconductor structure 100 is a multilayer semiconductor structure in which an intrinsic (i) or undoped region 150 (which includes the second barrier region 130, the active region 120, and the third barrier region 115) is between p-type region 155 (which includes the fourth barrier region 110 and the p-type contact region 105) and n-type region 160 (which includes the n-type contact region 140 and the first barrier region 135). The p-type contact region 105 and the n-type contact region 140 have a high doping concentration (+), and the fourth barrier region 110 and the first barrier region 135 have a low doping concentration (−).

In operation, the semiconductor structure 100 operates to generate light as follows. Current is applied to p-type contact region 105 and n-type contact region 140. Electrons of the n-type contact region 140 recombine with holes of the p-type contact region 105 in active region 120 to release energy in the form of light.

The term "p-type" refers to the addition of impurities to an intrinsic semiconductor that creates deficiencies of valence electrons, and examples of p-type dopants include, for example, boron, aluminum, gallium and indium. The term "n-type" refers to the addition of impurities that contributes free electrons to an intrinsic semiconductor. The doping can be achieved using "in-situ" doping during epitaxial growth of the semiconductor materials that form the semiconductor structure 100, or doping can be achieved by utilizing ion implantation or gas phase doping. Examples of n-type dopants include, for example, antimony, arsenic and phosphorous.

The semiconductor structure 100 can include a substrate 145. Substrate 145 can include a semiconductor material such as Si, GaAs, InP, GaN, SiC, and sapphire. In embodiments, the substrate can include semi-insulating GaAs.

The semiconductor structure 100 can include a p-type contact region 105 including GaAs. In some embodiments of the present invention, p-type contact region 105 can be about 30 nm to about 200 nm thick. N-type contact region 140 can include GaAs. N-type contact region 140 can be about 30 nm to about 200 nm thick.

P-type contact region 105 and n-type contact region 140 can include a semiconductor material such as Si, GaAs, InP, GaN, SiC, and sapphire. In some embodiments of the present invention, the p-type contact region 105 and n-type contact region 140 can each include a same material as the substrate. For example, the p-type contact region 105 and n-type contact region 140 can each include semi-insulating GaAs.

In some embodiments of the invention, a first barrier can include first barrier region 135 and second barrier region 130, and a second barrier can include third barrier region 115 and fourth barrier region 110. First barrier region 135 and second barrier region 130, which make up the first barrier, include a same semiconductor material, for example, InGaP. The first barrier includes two barrier regions 130 and 135, with an undoped portion of the first barrier designated as second barrier region 130 and an n– doped portion of the first barrier designated as first barrier region 135. N– doped first barrier region 135 can be adjacent to n+ dope contact region 140.

Similarly, third barrier region 115 and fourth barrier region 110, which make up the second barrier, include a same semiconductor material, for example, InGaP. The second barrier includes two barrier regions 110 and 115, with an undoped portion of the second barrier designated as third barrier region 115 and a p– doped portion of the second barrier designated as fourth barrier region 110. P– doped fourth barrier region 110 can be adjacent to p+ doped contact region 105. Barrier regions 110 and 115 can be between active region 120 and the p-type contact region 105, and barrier regions 130 and 135 can be between active region 120 and the n-type contact region 140.

In some embodiments of the present invention, region 115 can be between active region 120 and region 110. Region 115 can be undoped, and can include InGaP. Region 115 can be about 10 nm to about 100 nm thick. Region 110 can be between region 115 and region 105. Region 110 can be adjacent, for example, directly adjacent, to region 105, and can be about 100 nm to about a few microns thick.

The barrier regions can include, for example, groups IH-V, H-VI, and IV-V compound semiconductors (for example, GaAs, GaAlAs, GaAlAsSb, GaAsSb, GaAlPSb, GaAlSb, GaAlInSb, GaSb, InAs, InAlAs, InGaAs, InGaP, InP, InAsP, InAlAsSb, InAlSb, InAsSb, InSb, AlAs, AlAsSb, AlSb, TlInP, TlInGaP, TlInGaAs, AflnAs, AflnAsSb, GaN, AlGaN, and InGaN, InGaAlN, InN, AlN, CdS, CdTe, CdHgTe, ZnS, ZnSe, ZnSSe, PbSe, PbTe, and PbSSe). In some embodiments of the present invention, the barrier regions can include InGaP.

In some embodiments of the present invention, the barrier regions may or may not include aluminum. For example, the barrier regions can include groups IH-V, H-VI, and IV-V compound semiconductors (for example, GaAs, GaAsSb, GaSb, InAs, InGaAs, InGaP, InP, InAsP, InAsSb, InSb, TlInP, TlInGaP, TlInGaAs, AflnAs, AflnAsSb, GaN, and InGaN, InN, CdS, CdTe, CdHgTe, ZnS, ZnSe, ZnSSe, PbSe, and PbTe, PbSSe). In contrast to reduced light efficiency and radiative emission that can be caused by aluminum at a low injection current, at high intensity or current, non-radiative recombination caused by aluminum can be minimized or negligible, for example, due to the rate of radiative recombination being proportional to the square of charge density and the rate of non-radiative recombination being proportional to the charge density itself.

Active region 120 can be between barrier regions 115 and 130. Active region 120 can include a single quantum well having a thickness of about 2 nm to about 10 nm. In some embodiments, the single quantum well thickness is about 7 nm.

In some embodiments of the present invention, the combination of an LED not including aluminum and a single quantum well can provide a synergistically improved efficiency at low injection current, at which charge density is low. For example, an LED according to some embodiments of the present invention can exhibit a ten times to more than one thousand times smaller peak efficiency current relative to a comparative LED, as will be described in further detail below. As previously described herein, a single quantum well increases charge density. As a rate of radiative recombination is proportional to the square of charge density and a rate of non-radiative recombination is proportional to the charge density itself an increase in charge density results in a rate of radiative recombination that is considerably greater than the rate of non-radiative recombination. Quantum efficiency of the LED is also increased by reducing the rate of non-radiative recombination by omitting aluminum, which causes non-radiative recombination at a low injection current. Accordingly, a single quantum well in combination with an LED not including aluminum can provide significant benefits in terms of quantum efficiency.

Active region 120 can be an undoped region including, for example, $In_xGa_{(1-x)}As$, where x=0 to 0.8, InGaAlP, or InGaAsP. In some embodiments of the present invention, active region 120 can be an undoped region including $In_{0.2}Ga_{0.8}As$ for infrared emission. The material included in active region 120 can be varied depending on a desired wavelength emission or color, for example, red, green, or blue.

Region 130 can be between active region 120 and region 135. Region 135 can be about 100 nm to about a few microns thick. Region 130 can be undoped and can include InGaP. Region 115 can be about 10 nm to about 100 nm thick. Region 135 can be between region 130 and contact region 140. Region 135 can be adjacent, for example, directly adjacent, to contact region 140. The index of refraction of barrier regions 115 and 130 can confine light emitted from active region 120 to the area between barrier regions 110 and 135, respectively.

A voltage applied to the contact region 105 can be positive enough with respect to the ground potential connected to the common contact region 140, and the resulting p-i-n structure can be forward biased. When the p-i-n structure is forward biased, current can flow from the voltage source to ground, supplying carriers to active region 120. Carriers, such as electrons and holes, in active region 120 can recombine and emit light.

In some embodiments of the present invention, the semiconductor structure 100 can include semi-insulating GaAs substrate 145. The semiconductor structure 100 can also include n+, e.g., highly doped, GaAs contact region 140, which can have a dopant concentration of, for example, $3\times10^{18}$ to $5\times10^{18}/cm^3$. The semiconductor structure 100 can also include n–, e.g., lightly doped, InGaP second barrier region 135, which can have a dopant concentration of, for example, $5\times10^{17}$ to $3\times10^{18}/cm^3$. The semiconductor structure 100 can also include intrinsic InGaP first barrier region 130, intrinsic $In_{0.2}Ga_{0.8}As$ quantum well 120, and intrinsic InGaP first barrier region 115. The semiconductor structure 100 can also include p–, e.g., lightly doped, InGaP second barrier region 110, which can have a dopant concentration of, for example, $5\times10^{17}$ to $3\times10^{18}/cm^3$. The semiconductor structure 100 can also include p+, e.g., highly doped, GaAs region 105, which can have a dopant concentration of, for example, $5 \times 10^{18}$ to $3 \times 10^{19}/cm^3$.

In some embodiments of the present invention, examples of a barrier/quantum well combination include AlGaN/GaN, AlGaN/InGaN, and GaN/InGaN. In some embodiments of the present invention that do not include aluminum containing material, examples of a barrier/quantum well combination include $InGaP/In_xGa_{(1-x)}As$, where x=0 to 0.8, InGaP/InGaAsP, InGaAsP/InGaAsP, and GaN/InGaN.

An example of how the semiconductor structure 100 operates in response to a forward bias will now be described. A forward bias current 10 is applied across contacts 145, 105 resulting in an injection current 10 flowing through the semiconductor structure 100. The injection current 10 injects electrons 20 from p-type semiconductor layer 110 to active region 120 and injects holes 30 from n-type semiconductor layer 130 to active region 120. The electrons 20 and holes 30 recombine in active region 120 and emit light 40.

In some embodiments of the invention, the semiconductor material of the first barrier (130, 135) does not contain aluminum, and the semiconductor material of the second barrier (110, 115) does not contain aluminum. Aluminum causes non-radiative recombination, which decreases quantum efficiency of the semiconductor structure 100.

In some embodiments of the invention, quantum efficiency of the semiconductor structure 100 can be improved by an increased charge density provided by a single quantum well 120. For example, the rate of radiative recombination, which is proportional to the square of charge density, can be significantly greater than the rate of non-radiative recombination, which is proportional to the charge density itself, and the effect of non-radiative recombination on the quantum efficiency can be reduced or minimized.

Figure 2:
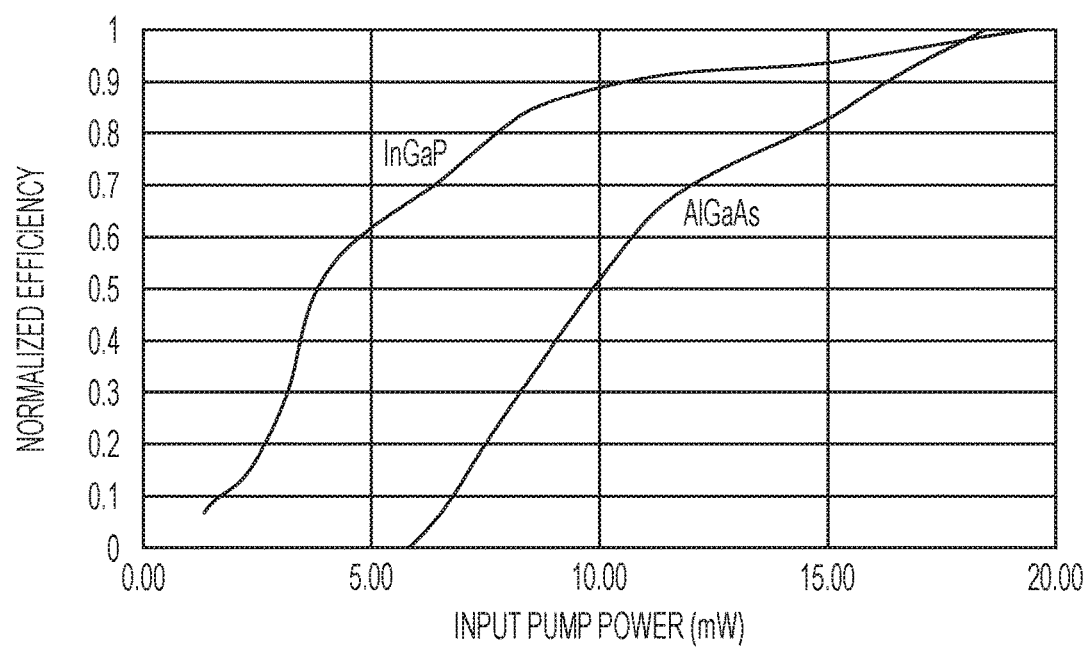
FIG. 2 depicts a graph of normalized external quantum efficiency versus input power (mW) according to one or more embodiments of the present invention.

FIG. 2 depicts a graph of normalized external quantum efficiency versus input power (mW) according to one or more embodiments of the invention. As depicted in FIG. 2, in a photoluminescence comparison, a non-Al barrier region including InGaP, exhibited better lower power performance relative to a barrier region including AlGaAs. Data measurements can be made using a high sensitivity detector.

Figure 3:
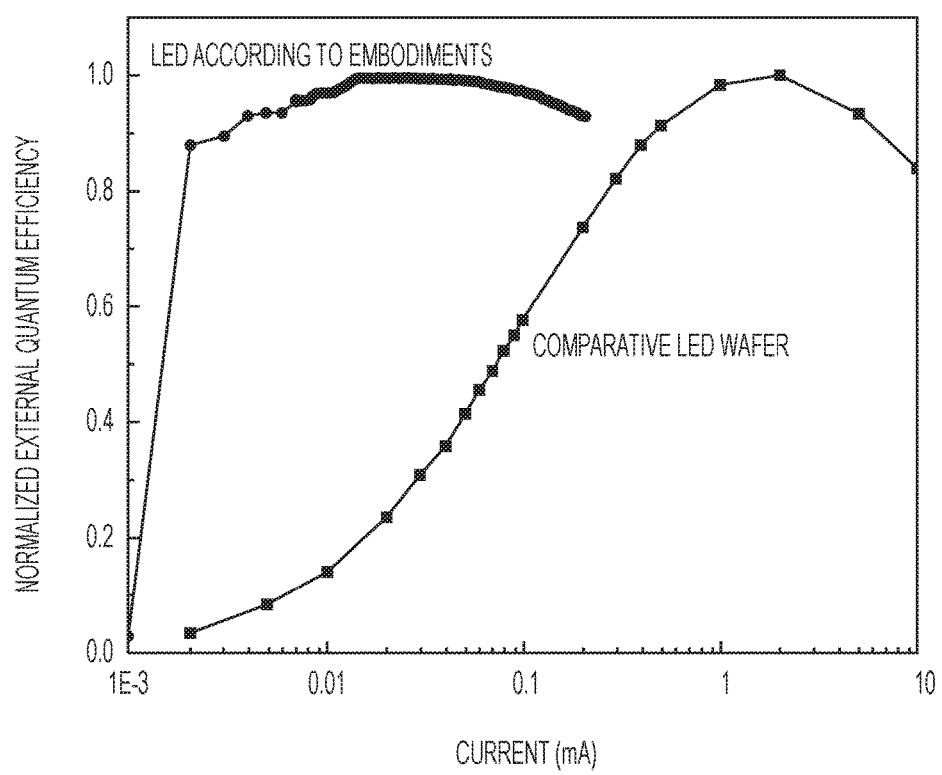
FIG. 3 depicts a graph of normalized external quantum efficiency versus input current (mA) according to one or more embodiments of the present invention.

FIG. 3 depicts a graph of normalized external quantum efficiency versus input current (mA) according to one or more embodiments of the invention. As depicted in FIG. 3, an LED device in accordance with embodiments of the present invention exhibited lowered input current for peak, or maximum, efficiency relative to a comparative device including thick multiple quantum and aluminum. For example, an LED including a thin single quantum well having a thickness of about 7 nm or about 10 nm can exhibit a ten times smaller peak efficiency current relative to a comparative LED including thick multiple quantum wells having a light emission region with a thickness of 220 nm and including aluminum.

In some embodiments of the present invention, peak quantum efficiency of an LED can be reached at an input/bias current of less than about 1 mA, for example, less than about 0.5 mA, about 2 µA to about 0.5 mA, about 10 µA, or about 20 µA. Input current of less than about 0.5 mA can equal about 85% to about 90% of the peak efficiency. As previously noted herein, quantum efficiency can be expressed as the ratio of photons emitted from an LED to carriers injected into the LED. In some embodiments, the peak or maximum quantum efficiency obtained by the above-identified input/bias currents is a ratio of photons emitted to carriers injected in a range from about 0.85 to about 1, for example, from about 0.9 to about 1.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor structure comprising:
    a first barrier region;
    a second barrier region; and
    a single quantum well having a preselected thickness between the first barrier region and the second barrier region; and
    wherein the preselected thickness is selected to achieve a predetermined charge density in the quantum well;
    wherein the predetermined charge density results from a predetermined bias current applied to the semiconductor structure;
    wherein the predetermined bias current comprises less than about 1 mA; and
    wherein the first barrier region includes InGaP and includes a doped region and an undoped region and the second barrier region includes InGaP and includes a doped region and an undoped region.

2. The semiconductor structure of claim 1, wherein:
    the predetermined bias current results in a predetermined quantum efficiency comprising a ratio of photons emitted to carriers injected in the single quantum well in a range from about 0.85 to about 1; and
    the predetermined bias current is less than about 0.5 mA.

3. The semiconductor structure of claim 2, wherein the preselected thickness is about 2 nm to about 10 nm.

4. The semiconductor structure of claim 1, wherein the single quantum well includes $In_{0.2}Ga_{0.8}As$.

5. The semiconductor structure of claim 4, further comprising:
    a first semiconductor region including GaAs, the first barrier region being between the first semiconductor region and the single quantum well; and
    a second semiconductor region including GaAs, the second barrier region being between the second semiconductor region and the single quantum well.

6. A semiconductor structure comprising:
    a first barrier region;
    a second barrier region; and
    a single quantum well between the first barrier region and the second barrier region, the single quantum well having a thickness of about 2 nm to about 10 nm,
    wherein the first barrier region includes InGaP and includes a doped region and an undoped region and the second barrier region includes InGaP and includes a doped region and an undoped region.

7. The semiconductor structure of claim 6, wherein the single quantum well includes $In_{0.2}Ga_{0.8}As$.

* * * * *